(12) United States Patent
Kubo et al.

(10) Patent No.: US 12,716,950 B2
(45) Date of Patent: Aug. 25, 2026

(54) POWER SUPPLY MONITORING CIRCUIT

(71) Applicant: DENSO CORPORATION, Kariya-city (JP)

(72) Inventors: Takamichi Kubo, Kariya-city (JP); Yuki Uchida, Kariya-city (JP); Yoshiaki Katsumi, Kariya-city (JP); Masashi Ueno, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 236 days.

(21) Appl. No.: 18/397,143

(22) Filed: Dec. 27, 2023

(65) Prior Publication Data

US 2024/0255577 A1 Aug. 1, 2024

(30) Foreign Application Priority Data

Jan. 30, 2023 (JP) ................................ 2023-012073

(51) Int. Cl.
*G01R 31/3835* (2019.01)
*B60R 16/03* (2006.01)

(52) U.S. Cl.
CPC .......... *G01R 31/3835* (2019.01); *B60R 16/03* (2013.01)

(58) Field of Classification Search
CPC ............................ G01R 31/3835; B60R 16/03
See application file for complete search history.

(56) References Cited

U.S. PATENT DOCUMENTS

| | | | | |
|---|---|---|---|---|
| 6,804,591 | B1 | 10/2004 | Miyazawa | |
| 11,719,752 | B1 * | 8/2023 | Herschell | G01R 31/3835 320/108 |
| 2007/0222630 | A1 * | 9/2007 | Sugama | G01R 31/31721 340/661 |
| 2023/0192106 | A1 * | 6/2023 | Park | B60W 50/14 701/29.1 |
| 2023/0311664 | A1 * | 10/2023 | Lu | G01R 31/006 320/116 |
| 2023/0339449 | A1 * | 10/2023 | Ozeki | B60R 16/04 |
| 2024/0124050 | A1 * | 4/2024 | Totoumi | B62D 5/046 |

FOREIGN PATENT DOCUMENTS

| | | | |
|---|---|---|---|
| JP | H10-290526 | A | 10/1998 |
| JP | 2002-034149 | A | 1/2002 |
| JP | 2015-199452 | A | 11/2015 |
| JP | 2021-69141 | A | 4/2021 |

* cited by examiner

*Primary Examiner* — Lee E Rodak
*Assistant Examiner* — Zannatul Ferdous
(74) *Attorney, Agent, or Firm* — Posz Law Group, PLC

(57) ABSTRACT

A power supply monitoring circuit monitors an in-vehicle power supply in an ECU. The ECU has power supply circuits powered by the in-vehicle power supply through a power supply line and supplying power to a downstream load. The power supply monitoring circuit includes a voltage supply monitoring circuit and a control circuit. The power supply line is commonly connected to the in-vehicle power supply and the power supply circuits by having a branching node where the power supply line is branched out from the in-vehicle power supply to the power supply circuits. The voltage monitoring circuit monitors the in-vehicle power supply by monitoring the power supply line. The control circuit controls the power supply circuits or a device powered by the power supply circuits to discharge operational charges remained in the power supply circuits or the device.

6 Claims, 3 Drawing Sheets

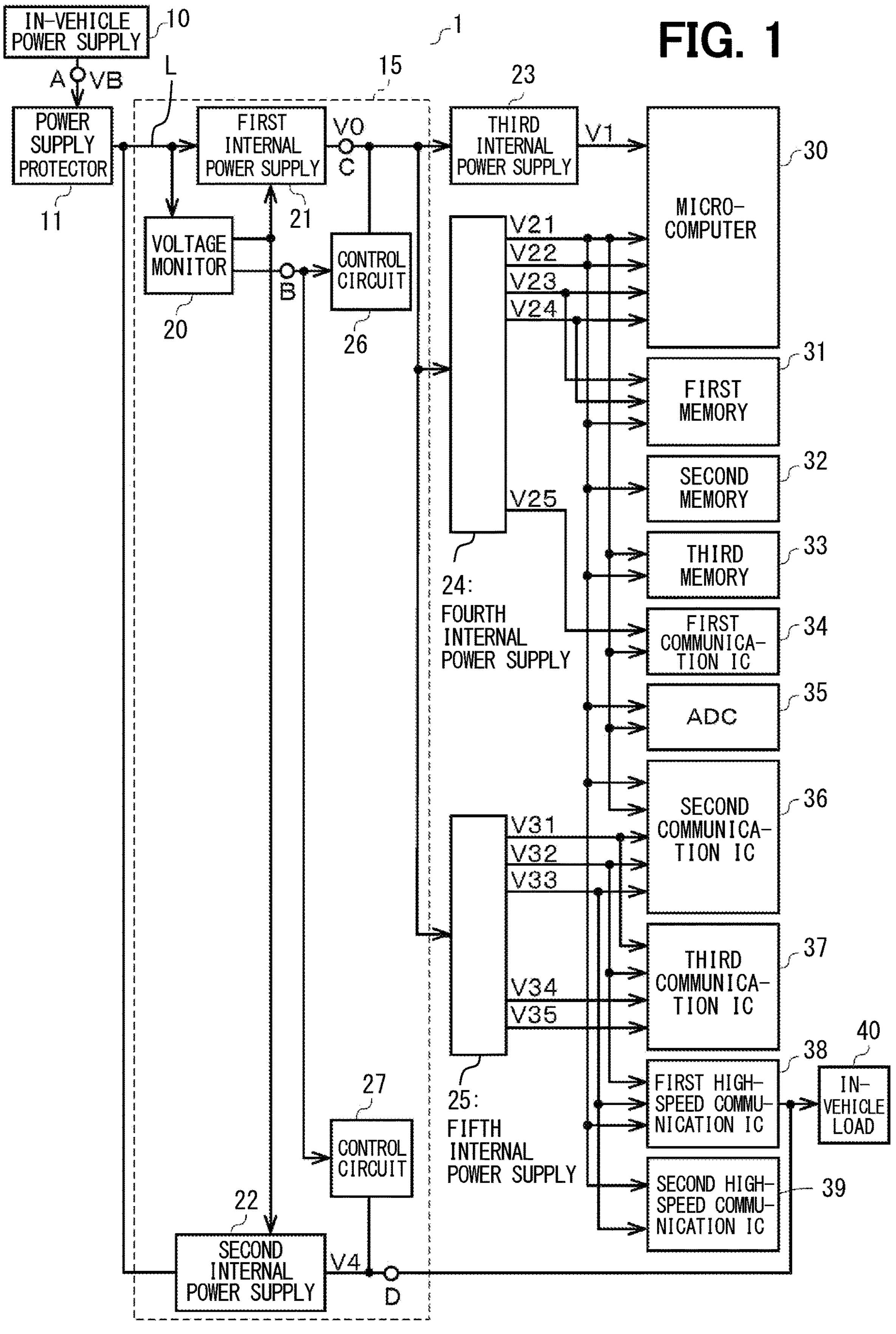
FIG. 1
IN-VEHICLE POWER SUPPLY
10
1
A
VB
L
15
POWER SUPPLY PROTECTOR
11
FIRST INTERNAL POWER SUPPLY
21
VO
C
23
THIRD INTERNAL POWER SUPPLY
V1
MICRO-COMPUTER
30
VOLTAGE MONITOR
20
B
CONTROL CIRCUIT
26
V21
V22
V23
V24
FIRST MEMORY
31
SECOND MEMORY
32
V25
THIRD MEMORY
33
24: FOURTH INTERNAL POWER SUPPLY
FIRST COMMUNICATION IC
34
ADC
35
SECOND COMMUNICATION IC
36
V31
V32
V33
THIRD COMMUNICATION IC
37
V34
V35
25: FIFTH INTERNAL POWER SUPPLY
FIRST HIGH-SPEED COMMUNICATION IC
38
IN-VEHICLE LOAD
40
SECOND HIGH-SPEED COMMUNICATION IC
39
CONTROL CIRCUIT
27
22
SECOND INTERNAL POWER SUPPLY
V4
D BATTERY VOLTAGE (IN-VEHICLE POWER SUPPLY) VB(POINT A)
RESET VOLTAGE
STARTING VOLTAGE
0V
T1
DISCHARGE CONTROL SIGNAL (POINT B)
DISCHARGE TIME
T2
FIRST INTERNAL POWER SUPPLY V0(POINT C)
H
OPERATION UNSTABLE REGION OF THIRD, FOURTH, AND FIFTH INTERNAL POWER SUPPLY
SECOND INTERNAL POWER SUPPLY V4(POINT D)
OPERATION UNSTABLE REGION OF IN-VEHICLE LOAD
t0
t0b
t2

POWER SUPPLY MONITORING CIRCUIT

CROSS REFERENCE TO RELATED APPLICATION

This application is based on Japanese Patent Application No. 2023-012073 filed on Jan. 30, 2023, the disclosure of which is incorporated herein by reference.

TECHNICAL FIELD

The present disclosure relates to a power supply monitoring circuit.

BACKGROUND

A vehicle may be equipped with a large number of electronic control units (ECUs), and the ECUs may be connected to a network. Moreover, the ECUs may also be integrated and connected to a power supply path of a power supply circuit.

SUMMARY

The present disclosure describes a power supply monitoring circuit including a voltage monitoring circuit and a control circuit.

BRIEF DESCRIPTION OF DRAWINGS

FIG. 1 is an electrical configuration diagram schematically showing a power supply control system according to an embodiment.

DETAILED DESCRIPTION

Figure 2:
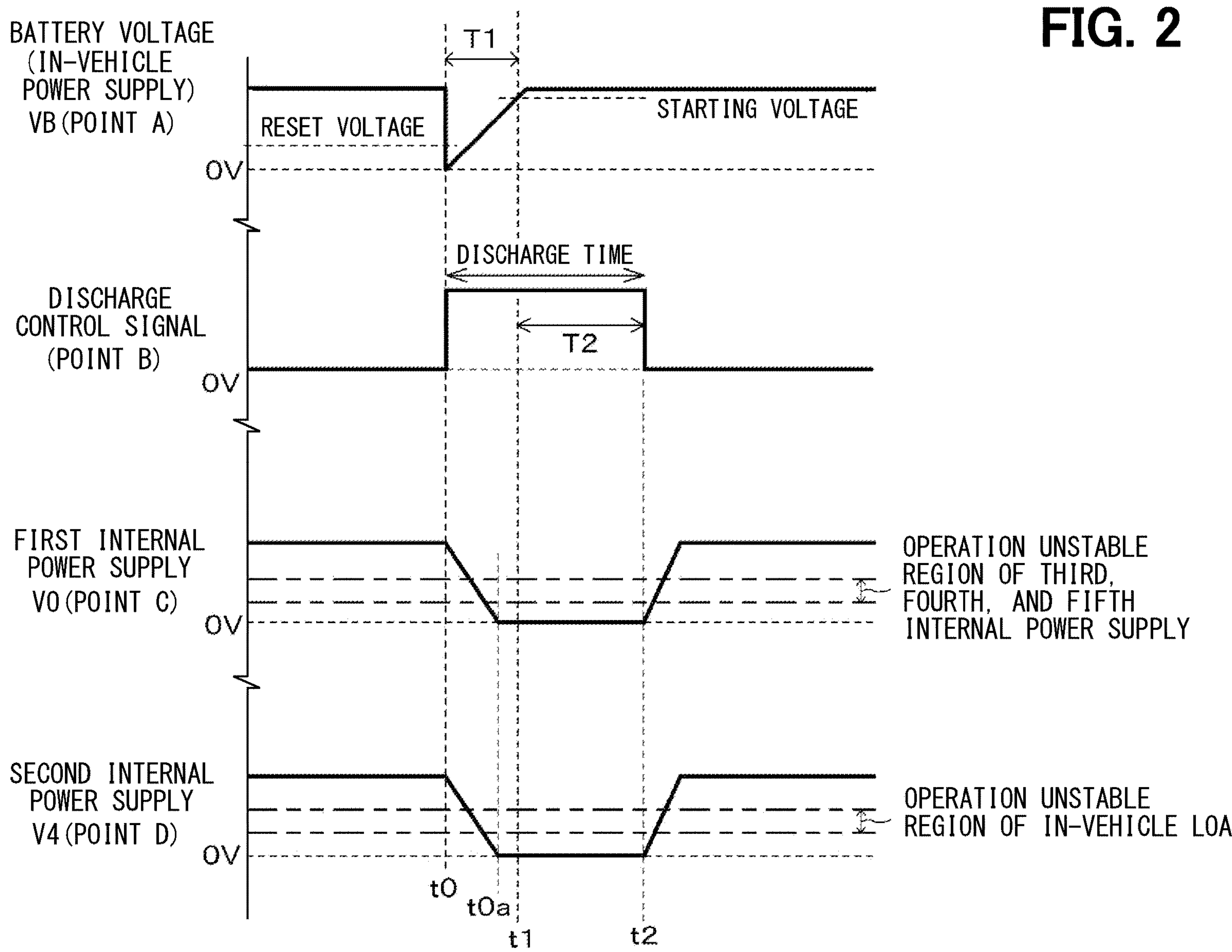
FIG. 2 illustrates a time chart schematically showing changes in a battery voltage, a signal at each node, and a power supply voltage in the embodiment.

In a situation where multiple ECUs adapted to a vehicle are integrated, the size of a mounting circuit for integrating the functions of ECUs may increase. As a result, a power supply path of a power supply circuit may be complicated, and the operation may be unstable when the power supply voltage fluctuates. For resolving the above issues, a device for turning on or off the power supply circuits simultaneously may be provided.

Since the above-mentioned device turns off or off the power supply circuits immediately when the power supply voltage exceeds a threshold value of the power supply monitoring circuit, the power supply circuit restarts from an intermediate potential before the completion of discharge of the power supply circuit at the time of resurgence from a momentary interruption. Therefore, it is possible that a downstream load may cause an erroneous operation.

According to an aspect of the present disclosure, a power supply monitoring circuit monitors an in-vehicle power supply in an ECU. The ECU has power supply circuits powered by the in-vehicle power supply through a power supply line and supplying power to a downstream load. The power supply monitoring circuit includes a voltage supply monitoring circuit and a control circuit. The power supply line is commonly connected to the in-vehicle power supply and the power supply circuits by having a branching node where the power supply line is branched out from the in-vehicle power supply to the power supply circuits. The voltage monitoring circuit monitors the in-vehicle supply by monitoring the power supply line. The control circuit controls the power supply circuits or a device powered by the power supply circuits to discharge operational charges remained in the power supply circuits or the device. The control circuit starts up when the voltage of the in-vehicle power supply crosses a predetermined reset voltage, and discharges the remaining charge from the power supply circuits or the device powered by the power supply circuits. At this time, the control circuit controls the power supply circuits to start up based on a condition that: the output voltage of each power supply circuit drops to a voltage that does not cause an unstable operation of the downstream loads; and the voltage of the in-vehicle power supply exceeds a predetermined start-up voltage.

When the voltage of the in-vehicle power supply drops below a predetermined reset voltage, the control circuit immediately starts up and executes the discharging process. As a result, the power supply circuit is turned off, and the output voltage of each power circuit drops until it reaches a voltage that does not cause the downstream load to be in the unstable operation. Subsequently, the power supply circuit starts up from a state in which the voltage of the in-vehicle power supply drops to a voltage that does not cause the unstable operation even though the voltage of the in-vehicle power supply exceeds a predetermined start-up voltage. Therefore, it is possible to prevent erroneous operation of the downstream loads and ensure their normal operation.

The following describes a power supply monitoring circuit according to an embodiment with reference to the drawings. An electronic control unit (ECU) 1 executes a variety of types of control of a vehicle, and receives power supply from an in-vehicle power supply 10 through a power supply protector 11 and a power supply line. The in-vehicle power supply 10 outputs a battery voltage VB based on a battery. The power supply protector 11 may be, for example, a fuse or a relay.

As shown in FIG. 1, the ECU 1 includes a first internal power supply 21 and a second internal power supply 22 as built-in power supply circuits. Each of the first internal power supply 21 and the second internal power supply 22 generates a downstream power from the power supplied through the power supply line L. A third internal power supply 23, a fourth internal power supply 24 and a fifth internal power supply 25 are connected after the first internal power supply 21. In other words, the third internal power supply 23, the fourth internal power supply 24 and the fifth internal power supply 25 are connected to the first internal power supply 21 on a downstream side of the first internal power supply 21. The first internal power supply 21 supplies the downstream power to the third internal power supply 23, the fourth internal power supply 24, and the fifth internal power supply 25, each of which is a downstream load disposed in a stage following the first internal power supply 21. The third internal power supply 23, the fourth internal power supply 24, and the fifth internal power supply 25 are constructed as downstream power supplies disposed in a stage following the first internal power supply 21.

Although not shown in the circuit illustrated in FIG. 1, for example, the first internal power supply 21 and the second internal power supply 22 are constructed by a linear regulator or a switching regulator, and each of the first internal power supply 21 and the second internal power supply 22 has a capacitor at the output. Each of the first internal power supply 21 and the second internal power supply 22 stores power at the capacitor and supplies power in a normal state.

The ECU 1 further includes a microcomputer 30, a first memory 31, a second memory 32, a third memory 33, a first communication integrated circuit (IC) 34, an analog-to-digital (AD) converter 35, a second communication IC 36, a third communication IC 37, a first high-speed communication IC 38 and a second high-speed communication IC 39.

The third internal power supply 23 generates and supplies an operational voltage V1 to the microcomputer 30. The fourth internal power supply 24 generates different DC voltages V21 to V25. The fourth internal power supply 24 supplies the operational voltages V21 to V24 to the microcomputer 30. The fourth internal power supply 24 supplies the operational voltages V22, V23, and V24 to the first memory 31.

The fourth internal power supply 24 supplies the operational voltage V22 to the second memory 32. The fourth internal power supply 24 supplies the operational voltages V21 and V22 to the third memory 33. The fourth internal power supply 24 supplies the operational voltages V21 and V25 to the first communication IC 34. The fourth internal power supply 24 supplies the operational voltages V21 and V22 to the AD converter 35. The fourth internal power supply 24 supplies the operational voltages V21 and V22 to the second communication IC 36. The fourth internal power supply 24 supplies the operational voltage V22 to the first high-speed communication IC 38 and the second high-speed communication IC 39.

The fifth internal power supply 25 generates different DC voltages V31 to V35. The fifth internal power supply 25 supplies the operational voltages V31 to V33 to the second communication IC 36. The fifth internal power supply 25 supplies the operational voltages V31, V32, V34, and V35 to the third communication IC 37. The fifth internal power supply 25 supplies the operational voltages V32 and V33 to the first high-speed communication IC 38. The fifth internal power supply 25 supplies the operational voltage V33 to the second high-speed communication IC 39.

The second internal power supply 22 superimposes a power supply on the power communication line between the first high-speed communication IC 38 and the in-vehicle load 40. The in-vehicle load 40 is in operation through the power superimposed on the power communication line, and is capable of establishing a high-speed communication connection with the in-vehicle load 40.

The AD converter 35 converts an externally input analog signal to a digital signal, and outputs the digital signal to the microcomputer 30. The microcomputer 30 refers to the converted value of the AD converter 35 and the contents stored in any one of the first to third memories 31 to 33, and independently executes a variety of controls of the vehicle. The first communication IC 34, the second communication IC 36, the third communication IC 37, and the second high-speed communication IC 39 execute necessary communication with other ECUs and in-vehicle loads (not shown).

The third internal power supply 23, the fourth internal power supply 24, the fifth internal power supply 25, the microcomputer 30, the first memory 31, the second memory 32, the third memory 33, the first communication IC 34, the AD converter 35, the second communication IC 36, the third communication IC 37, the first high-speed communication IC 38, the second high-speed communication IC 39, and the in-vehicle load 40 serve as downstream loads to which the first internal power supply 21 and the second internal power supply 22 supply power. In the following, the above-mentioned devices may also be simply referred to the downstream loads 23 to 25, 30 to 40 on some occasions.

The power supply monitoring circuit 15 includes a voltage monitoring circuit 20 and control circuits 26 and 27, and monitors the in-vehicle power supply 10. The voltage monitoring circuit 20 monitors the power supply line L having a branching node at which the power supply line L is branched out from the in-vehicle power supply to the first internal power supply 21 and the second internal power supply 22. The control circuit 26 enables discharge of operational charges supplied from the first internal power supply 21 to the third internal power supply 23, the fourth internal power supply 24, and the fifth internal power supply 25. The control circuit 26, for example, includes a resistor and a digital switch (not shown) connected to the output capacitor of the first internal power supply 21. By turning on the digital switch, the charge accumulated in the capacitor can be discharged through the resistor.

The control circuit 27 enables the discharge of operational charges from the second internal power supply 22 to the in-vehicle load 40 functioning as a block or a device, or from the in-vehicle load 40, which is powered by the second internal power supply 22, for operational purposes. The control circuit 27 includes a resistor and a digital switch (not shown in the drawing), which are connected to the output capacitor of the second internal power supply 22. By turning on the digital switch, the accumulated charge in the capacitor can be discharged through the resistor.

The control circuits 26 and 27 start up when the voltage of the in-vehicle power supply 10 crosses or drops below a predetermined reset voltage, and discharge any remaining charge from the first internal power supply 21, second internal power supply 22, or the in-vehicle load 40 that is supplied with power. The power supply monitoring circuit 15 is capable of starting up the first internal power supply 21 and the second internal power supply 22, based on a condition that: the output voltage of the first internal power supply 21 and the second internal power supply 22 drop to a voltage that does not cause the unstable operation of the downstream loads 23 to 25, 30 to 40; and the voltage of the in-vehicle power supply 10 exceeds a predetermined startup voltage.

Figure 3:
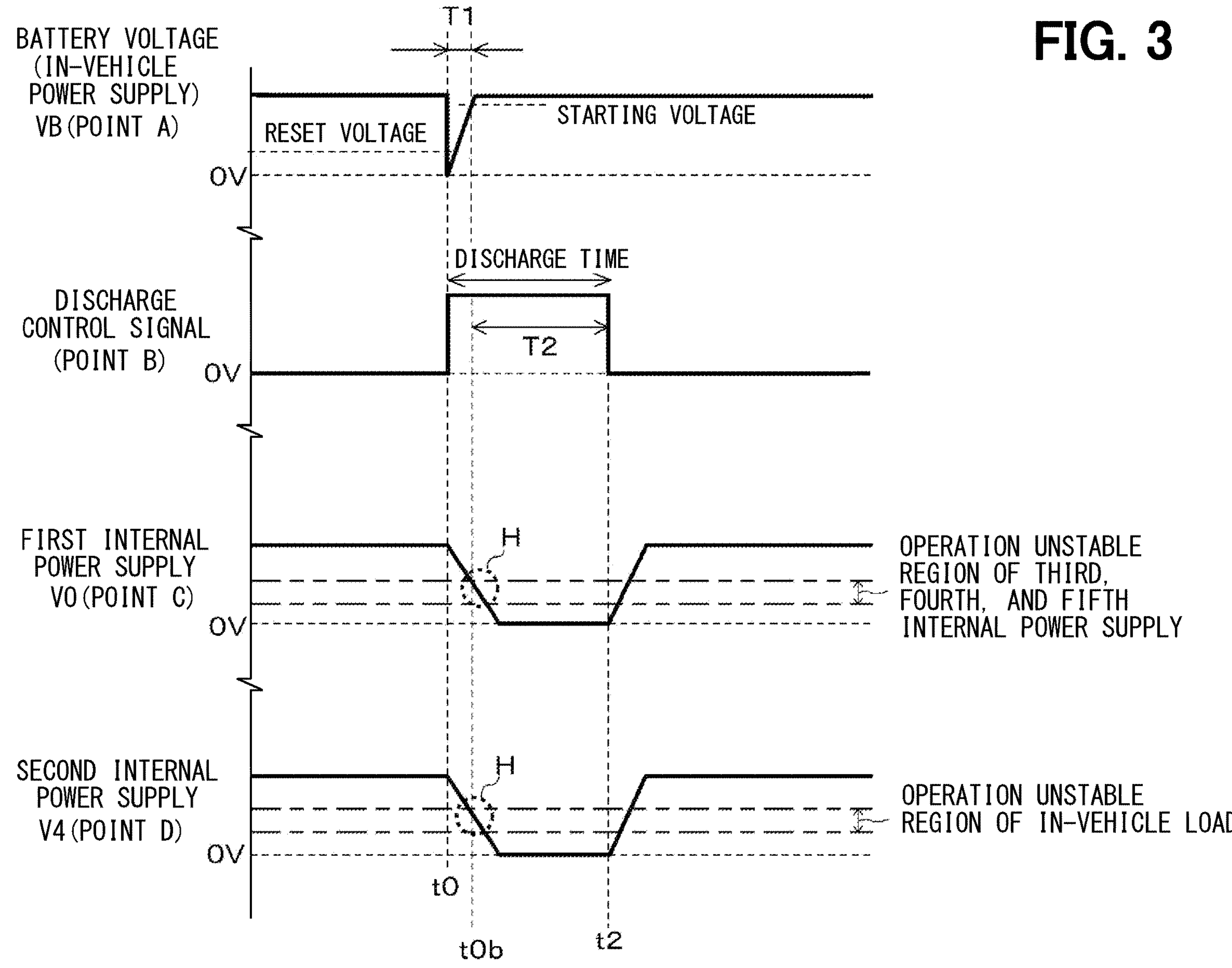
FIG. 3 illustrates a time chart schematically showing changes in a battery voltage, a signal at each node, and a power supply voltage in a comparative example.

The following describes the operation of the above configuration in detail with reference to FIGS. 2 and 3. In the normal state, the voltage monitoring circuit 20 monitors the voltage of the power supply line L. As shown in FIG. 2, the internal power supplies 23 to 25, respectively, have predefined operation unstable regions based on the voltage supply requirements of the downstream loads 30 to 39 connected in a stage following the internal power supplies 23 to 25. Similarly, the operation unstable region of the in-vehicle load 40 is also predefined.

In a usual case where the battery voltage VB is provided within a specified range (e.g., around 12 volts), the first internal power supply 21 and the second internal power supply 22 output voltages higher than these operation unstable regions. If there is a sudden drop in the battery voltage VB of the in-vehicle power supply 10 due to factors such as an increase load in a vehicle load, the voltage monitoring circuit 20 detects, for example, a crossing (lowering) of a predetermined reset voltage at timing t0.

When the voltage of the in-vehicle power supply 10 drops below the predetermined reset voltage, the voltage monitoring circuit 20 outputs a discharge control signal to the control circuits 26, 27, the first internal power supply 21, and the second internal power supply 22. As a result, the control circuits 26 and 27 immediately start up and discharge the charge accumulated in the output capacitors of the first internal power supply 21 and the second internal power supply 22. As a result, the voltage V0 of the first internal power supply 21 and the voltage V4 of the second internal power supply 22 gradually decrease, and the first internal power supply 21 and the second internal power supply 22 are turned off at, for example, timing t0*a* in FIG. 2.

At timing t0*a*, the voltage V0 of the first internal power supply 21 and the voltage V4 of the second internal power supply 22 have dropped to a voltage that does not cause the unstable operation of the downstream loads 23 to 25, 30 to 40 to be in the unstable operation. Since the output of the first internal power supply 21 is connected to the third internal power supply 23, the fourth internal power supply 24, and the fifth internal power supply 25 at the identical nodes, it is possible to reset the third internal power supply 23, the fourth internal power supply 24, and the fifth internal power supply 25 simultaneously. In other words, when the output of the in-vehicle power supply 10 drops below a predetermined reset voltage, the first internal power supply 21 is reset, and then the third to fifth internal power supplies 23 to 25 are reset all at once.

Subsequently, at timing t0 to t1, the battery voltage VB is restored to exceed a predetermined start-up voltage. When the batter voltage VB exceeds the predetermined start-up voltage at timing t1, one of the start-up conditions is satisfied. Subsequently, it is possible to start up the first internal power supply 21 and the second internal power supply 22. The start-up voltage may also be referred to as a starting voltage as illustrated in FIGS. 2, 3.

At this time, the first internal power supply 21 and the second internal power supply 22 may start up from a state where the battery voltage VB of the in-vehicle power supply 10 drops below a voltage level that does not cause the unstable operation of the downstream loads 23 to 25, 30 to 40 even though the battery voltage VB exceeds the predetermined start-up voltage. In other words, at this time, the first internal power supply 21 and the second internal power supply 22 may start up from a state where the battery voltage VB of the in-vehicle power supply 10 drops to the lower limit voltage of the operation unstable range as the power-on reset voltage below the lower limit voltage of the operation unstable range (for example, 0 volt). In this case, it is possible to prevent erroneous operations of the downstream loads 23 to 25, 30 to 40 and ensure their normal operation. Furthermore, during the resurgence process, it is necessary for the third internal power supply 23 to the fifth internal power supply 25 to be started only after the first internal power supply 21 has been started. Therefore, the power supply sequence will not be disrupted.

Comparison with Comparative Example

For example, considering a situation illustrated in FIG. 3, where the timing of the battery voltage VB of the in-vehicle power supply 10 exceeding the predetermined start-up voltage becomes faster than the above-mentioned situation. In this situation, both of the voltage V0 of the first internal power supply 21 and the voltage V4 of the second internal power supply 22 may be located at an operation unstable region indicated by a symbol H at timing t0*b*. In this situation, if the output resurges from the timing t0*b* in FIG. 3, the power supplied to the downstream loads 23 to 25 and 30 to 40 will become unstable, which may not be desirable.

According to the present embodiment, the voltage monitoring circuit 20 starts up the first internal power supply 21 and the second internal power supply 22 from a state where the voltage has decreased to a voltage lower than the lower limit voltage of the operation unstable region. Therefore, it is possible to prevent the downstream loads 23 to 25 and 30 to 40 from erroneous operations, and it is possible to allow the downstream loads 23 to 25 and 30 to 40 to operate normally.

As shown at timings t1 to t2, the voltage monitoring circuit 20 delays the resurgence of the outputs of the first internal power supply 21 and the second internal power supply 22 by a predetermined time T2 even if the start-up voltage exceeds a predetermined start-up voltage. By delaying the resurgence of the outputs of the first internal power supply 21 and the second internal power supply 22, sufficient discharge time can be ensured at the time of startup, and the device can be reliably restarted from a discharged state. Regarding the discharge time of the second internal power supply 22, an erroneous operation can be prevented by similarly ensuring the discharge time in accordance with the required specifications of the in-vehicle load 40.

Other Embodiments

The present disclosure is not limited to the above-described embodiments, i.e., may be modified or expanded in the following manner. Although the present disclosure describes the method of delaying the outputs of first internal power supply 21 and the second internal power supply 22 until the timing t2, which is a predetermined time T2 after the battery voltage VB reaches the predetermined start-up voltage, the present disclosure is not limited to the above-mentioned method. With regard to a method for detecting the timing at which the voltage at which the downstream loads 23 to 25 and 30 to 40 will not cause unstable operation, a timer may be adopted to count a predetermined delay time (>T1) after the in-vehicle power supply 10 crosses the reset voltage. In addition, it is possible to actually detect the voltage V0 of the first internal power supply 21 and the voltage V4 of the second internal power supply 22. Therefore, the first internal power supply 21 and the second internal power supply 22 may be restarted by using this detection method from the detected timing.

The ECU 1 and the technique according to the present disclosure may be achieved by a dedicated computer provided by constituting a processor and a memory programmed to execute one or more functions embodied by a computer program. Alternatively, the ECU 1 and the technique according to the present disclosure may be achieved by a dedicated computer provided by constituting a processor with one or more dedicated hardware logic circuits.

Alternatively, the ECU 1 and the technique according to the present disclosure may be achieved using one or more dedicated computers constituted by a combination of the processor and the memory programmed to execute one or more functions and the processor with one or more hardware logic circuits. The computer program may be stored, as instructions to be executed by a computer, in a tangible non-transitory computer-readable medium. Namely, the means and/or the functions which are provided by the processor and the like may be provided by software stored in tangible memory devices and computers for executing them, only software, only hardware, or a combination thereof. For example, some or all of the functions provided by the processor may be realized as hardware. A mode in which a certain function is realized as hardware includes a mode in which one or more ICs are used.

While the present disclosure has been described with reference to embodiments thereof, it is to be understood that the disclosure is not limited to the embodiments and constructions. The present disclosure encompasses various modifications and variations within the scope of equivalents. Furthermore, various combination and formation, and other combination and formation including one, more than one or less than one element may be made in the present disclosure.

What is claimed is:

1. An in-vehicle power supply monitoring circuit configured to monitor an in-vehicle power supply in an electronic control unit having the in-vehicle power supply monitoring circuit, the in-vehicle power supply monitor circuit comprising:

a first internal power supply circuit configured to be powered by the in-vehicle power supply through a power supply line and to supply power to a downstream load;

a second internal power supply circuit configured to be powered by the in-vehicle power supply through the power supply line and to supply power to the downstream load, wherein the power supply line includes a branching node at which the power supply line is branched out from the in-vehicle power supply line to the first and second internal power supply circuits;

a voltage monitoring circuit configured to monitor the in-vehicle power supply by monitoring the power supply line; and a control circuit configured to start up in response to a voltage of the in-vehicle power supply crossing a predetermined reset voltage and control the first and second internal power supply circuits or a device powered by the first and second internal power supply circuits to discharge an operational charge remained in the first and second internal power supply circuits or the device, and control the first and second internal power supply circuits to start up based on a condition that an output voltage of the first and second internal power supply circuits drops to a voltage level that does not cause an unstable operation of the downstream load, and the voltage of the in-vehicle power supply exceeds a predetermined start-up voltage.

2. The in-vehicle power supply monitoring circuit according to claim 1, wherein the voltage monitoring circuit is configured to delay resurgence of output of the first and second internal power supply circuits by a predetermined time even though the voltage of the in-vehicle power supply exceeds the predetermined start-up voltage.

3. The in-vehicle power supply monitoring circuit according to claim 1, further comprising:

a plurality of downstream power supplies connected to a downstream part of at least one of the first and second internal power supply circuits, the plurality of downstream power supplies configured to be simultaneously reset by the at least one of the first and second internal power supply circuits.

4. The in-vehicle power supply monitoring circuit according to claim 1, wherein the downstream load is at least one of an additional internal power supply circuit, a microcontroller, a communication integrated circuit, and an analog-to-digital converter, and the additional internal power supply circuit is different from the first internal power supply circuit and the second internal power supply circuit.

5. The in-vehicle power supply monitoring circuit according to claim 1, wherein the voltage monitoring circuit is a single voltage monitoring circuit configured to monitor an input voltage of each of the first internal power supply circuit and the second internal power supply circuit.

6. The in-vehicle power supply monitoring circuit according to claim 1, wherein each of the first internal power supply circuit and the second internal power supply circuit is one of a linear regulator or a switching regulator.

* * * * *